US011120745B2

(12) United States Patent
Kim

(10) Patent No.: US 11,120,745 B2
(45) Date of Patent: Sep. 14, 2021

(54) SCAN DRIVER

(71) Applicant: Samsung Display Co., Ltd., Yongin-Si (KR)

(72) Inventor: Jong Hee Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/734,981

(22) Filed: Jan. 6, 2020

(65) Prior Publication Data
US 2020/0219451 A1 Jul. 9, 2020

(30) Foreign Application Priority Data
Jan. 7, 2019 (KR) .................. 10-2019-0001779

(51) Int. Cl.
G09G 3/3266 (2016.01)
(52) U.S. Cl.
CPC ... *G09G 3/3266* (2013.01); *G09G 2300/0426* (2013.01); *G09G 2300/08* (2013.01); *G09G 2330/028* (2013.01)
(58) Field of Classification Search
CPC ...... G09G 3/32; G09G 3/3208; G09G 3/3225; G09G 3/3266; G09G 3/36; G09G 3/3674; G09G 3/3677; G09G 2300/0421; G09G 2300/0426; G09G 2300/08; G09G 2300/0819; G09G 2310/0205; G09G 2310/0216; G09G 2310/0291; G09G 2320/04; G09G 2320/043; G09G 2320/045; G09G 2330/028
See application file for complete search history.

(56) References Cited

U.S. PATENT DOCUMENTS

| | | | |
|---|---|---|---|
| 9,524,690 B2 | 12/2016 | Lim et al. | |
| 9,875,710 B2 | 1/2018 | Kim et al. | |
| 10,186,198 B2 | 1/2019 | Kim et al. | |
| 2013/0278570 A1* | 10/2013 | Park | G09G 3/3677 345/204 |
| 2014/0152629 A1* | 6/2014 | So | G09G 3/3266 345/205 |
| 2017/0047030 A1 | 2/2017 | Kim et al. | |
| 2017/0110050 A1* | 4/2017 | Park | G09G 3/3208 |
| 2018/0151143 A1* | 5/2018 | Kim | G06F 3/04184 |
| 2019/0189053 A1 | 6/2019 | Kim et al. | |

OTHER PUBLICATIONS

Shin, Hong-Jae, et al. "A Novel OLED Display Panel with High-Reliability Integrated Gate Driver Circuit using IGZO TFTs for Large-Sized UHD TVs." SID 2018 Digest, p. 358-361.

* cited by examiner

Primary Examiner — Nathan Danielsen
(74) Attorney, Agent, or Firm — H.C. Park & Associates, PLC

(57) ABSTRACT

A scan driver including stages that are connected to scan lines respectively and supply scan signals to the scan lines in response to voltages of 11th and 12th nodes, and a selective drive circuit that is connected to i (i is a natural number of 2 or greater) stages and includes a first node and a second node. Each of the stages includes a first connection transistor that is connected between the first node and the 11th node and a second connection transistor that is connected between the second node and the 12th node. The first connection transistor and the second connection transistor are turned on by a second control signal to electrically connect the first node to the 11th node and the second node to the 12th node, respectively.

11 Claims, 7 Drawing Sheets

SCAN DRIVER

CROSS-REFERENCE TO RELATED APPLICATION

This application claims priority from and the benefit of Korean Patent Application No. 10-2019-0001779, filed on Jan. 7, 2019, which is hereby incorporated by reference for all purposes as if fully set forth herein.

BACKGROUND

Field

Exemplary embodiments of the invention relate generally to a scan driver.

Discussion of the Background

A display device includes a pixel portion including a plurality of pixels, a scan driver, a data driver, a timing controller, and the like. The scan driver includes stages connected the scan lines, and the stages supply scan signals to scan lines connected to the stages in response to signals from the timing controller.

A display device performs driving for compensating deterioration and a characteristic change of a drive transistor outside a pixel circuit by sensing a threshold voltage or mobility of the drive transistor included in the pixel circuit. To this end, the scan driver may be configured to further supply a sensing signal through a sensing line. At this time, a selective drive circuit portion may be provided in each stage so as to select a specific pixel string during one frame period and to sense the selected pixel string.

The above information disclosed in this Background section is only for understanding of the background of the inventive concepts, and, therefore, it may contain information that does not constitute prior art.

SUMMARY

Devices constructed according to exemplary embodiments of the invention are directed to providing a stage configured to share a selective drive circuit portion with at least one different stage.

Furthermore, various exemplary embodiments of the inventive concepts are directed to provide a scan driver configured such that a plurality of stages share one selective drive circuit.

Additional features of the inventive concepts will be set forth in the description which follows, and in part will be apparent from the description, or may be learned by practice of the inventive concepts.

A scan driver according to an exemplary embodiment of the inventive concepts includes stages that are connected to scan lines respectively and supply scan signals to the scan lines in response to voltages of 11th and 12th nodes, and a selective drive circuit that is connected to i (i is a natural number of 2 or greater) stages and includes a first node and a second node. Each of the stages includes a first connection transistor that is connected between the first node and the 11th node and a second connection transistor that is connected between the second node and the 12th node. The first connection transistor and the second connection transistor are turned on by a second control signal to electrically connect the first node to the 11th node and the second node to the 12th node, respectively.

In addition, the selective drive circuit may include a first transistor that is connected between an input terminal of a first carry signal and a third node and has a gate electrode which is connected to an input terminal of a first control signal, a second transistor that is connected between the third node and a first power supply and has a gate electrode which is connected to a fourth node, a third transistor that is connected between the third node and the fourth node and has a gate electrode which is connected to an input terminal of the first control signal, a fourth transistor that is connected between the first power supply and the first node and has a gate electrode which is connected to the fourth node, a fifth transistor that is connected between the fourth node and a second power supply and has a gate electrode which is connected to the fourth node, and a capacitor that is connected between the first power supply and the fourth node.

The first carry signal and the first control signal may overlap each other at least once during a display period in a frame.

The first transistor, the second transistor, and the third transistor may control a voltage of the fourth node in response to the first carry signal and the first control signal.

The fourth transistor may be turned on in response to a voltage of the fourth node to supply the first node with a voltage of the first power supply.

The fifth transistor may be turned on in response to a voltage of the fourth node to supply the second node with a voltage of the second power supply.

The second control signal may be supplied to at least one selected stage during a display period in one frame.

The selected stage may supply a first scan signal to a first scan line in response to a voltage of the 11th node and supply a second scan signal to a second scan line in response to a voltage of the 12th node during a sensing period between the display periods.

In addition, each of the stages may further include an initialization transistor that initializes a voltage at the 11th node to a voltage of the second power supply in response to a reset signal.

The i stages that are connected to the same selective drive circuit may be supplied with first to ith clock signals, respectively.

The first to ith clock signals may have the same period, and the nth (n is a natural number from 2 to i) clock signal may be shifted in phase by 1/i cycle as compared with the (n−1)th clock signal.

The i stages may each output a carry signal to a next stage in response to the first through ith clock signals.

A scan driver according to exemplary embodiments of the inventive concepts enables selective sensing of pixel strings.

In addition, the scan driver according to exemplary embodiments of the inventive concepts is configured such that a plurality of stages share one selection circuit, thereby reducing a dead space of a display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
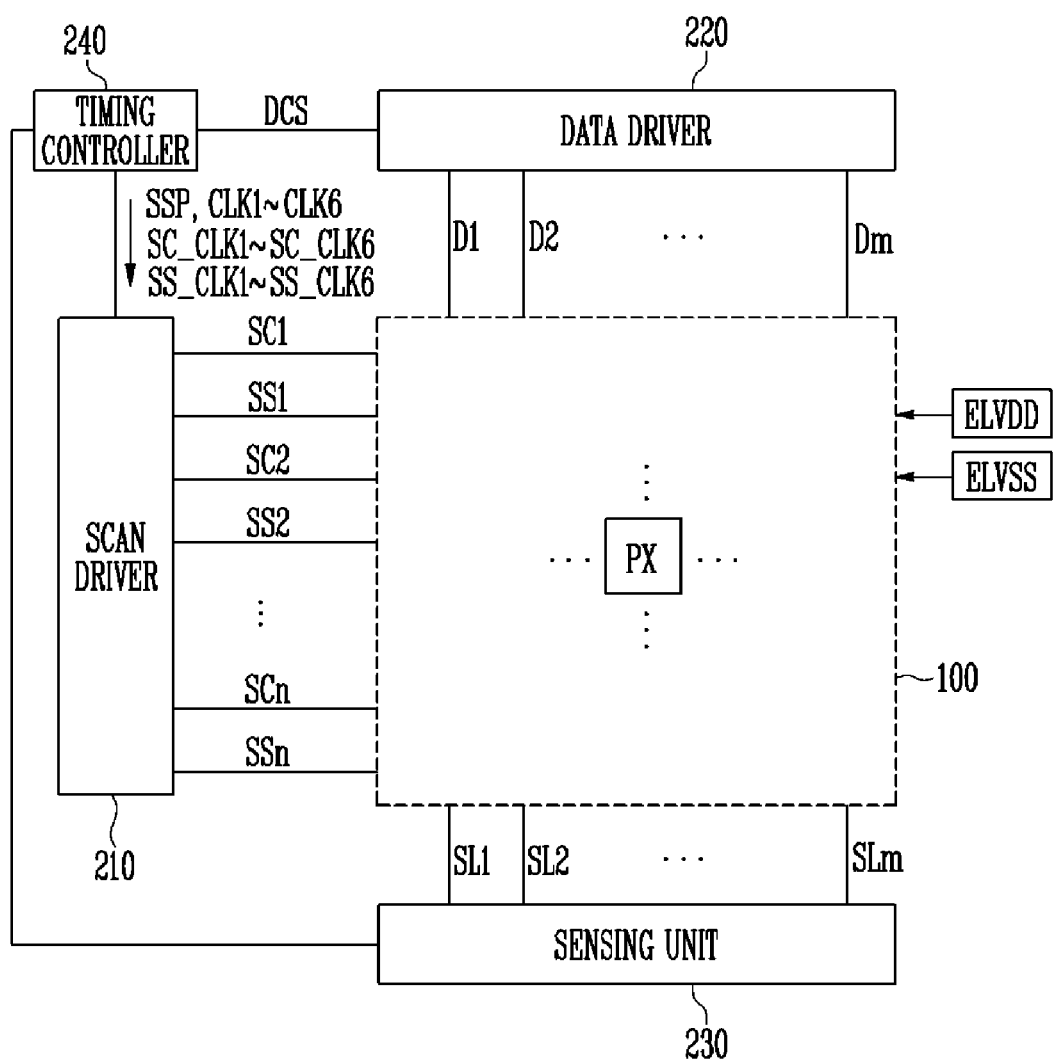
FIG. 1 is a block diagram illustrating a display device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or to groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram illustrating a display device according to an exemplary embodiment of the inventive concepts.

Referring to FIG. 1, the display device according to the exemplary embodiment of the inventive concepts may include a display unit 100 including a plurality of pixels PX, a scan driver 210, a data driver 220, a sensing unit 230, and a timing controller 240.

The timing controller 240 may generate a scan driving control signal and a data driving control signal based on externally input signals. The scan driving control signal generated by the timing controller 240 may be supplied to the scan driver 210 and a data driving control signal DCS may be supplied to the data driver 220.

The scan driving control signal may include a plurality of clock signals CLK1 to CLK6, SC_CLK1 to SC_CLK6, and SS_CLK1 to SS_CLK6 and a scan start signal SSP. The scan start signal SSP can control output timing of a first scan signal.

The plurality of clock signals CLK1 to CLK6, SC_CLK1 to SC_CLK6, and SS_CLK1 to SS_CLK6 supplied to the scan driver 210 may include first to sixth clock signals CLK1 to CLK6, first to sixth scan clock signals SC_CLK1 to SC_CLK6, and first to sixth sensing clock signals SS_CLK1 to SS_CLK6. The first to sixth clock signals CLK1 to CLK6 may be used to shift the scan start signal SSP. The first to sixth scan clock signals SC_CLK1 to SC_CLK6 may be used to output scan signals corresponding to at least one of the scan start signal SSP and the first to sixth clock signals CLK1 to CLK6. The first to sixth sensing clock signals SS_CLK1 to SS_CLK6 may be used to output a sensing signal corresponding to at least one of the scan start signal SSP and the first to sixth clock signals CLK1 to CLK6. In addition, the scan driver 210 may further receive a clock signal other than the clock signals CLK1 to CLK6, SC_CLK1 to SC_CLK6, and SS_CLK1 to SS_CLK6.

The data drive control signal may include a source start pulse and a clock signal. The source start pulse controls a sampling start time of data, and the clock signal may be used to control a sampling operation.

The scan driver 210 may output scan signals in response to the scan driving control signal. The scan driver 210 may sequentially supply the scan signals to first scan lines SC1 to SCn. Here, the scan signal may be set to a gate-on voltage (for example, a high-level voltage) such that a transistor included in the pixel PX can be turned on.

The scan driver 210 may output the sensing signals in response to the scan driving control signal. The scan driver 210 may supply the sensing signals to at least one of second scan lines SS1 to SSn. Here, the sensing signal may be set to a gate-on voltage (for example, a high-level voltage) such that a transistor included in the pixel PX can be turned on.

The data driver 220 may supply data signals to data lines D1 to Dm in response to the data driving control signal. The data signals supplied to the data lines D1 to Dm may be supplied to the pixels PX to which the scan signals are supplied. For this, the data driver 220 may supply the data signals to the data lines D1 to Dm so as to synchronize with the scan signals.

The sensing unit 230 may supply initialization power to the pixels to which the sensing signals are supplied through the sensing lines SL1 to SLm and may measure deterioration information of the pixels. Although the sensing unit 230 is illustrated as a separate configuration in FIG. 1, the sensing unit 230 may be included in the data driver 220.

The display unit 100 may include a plurality of pixels PX connected to the data lines D1 to Dm, the first scan lines SC1 to SCn, the second scan lines SS1 to SSn, and the sensing lines SL1 to SLm.

The pixels PX may receive a first power ELVDD and a second power ELVSS from the outside.

The respective pixels PX may receive data signals from the data lines D1 to Dm when the scan signals are supplied to the first scan lines SC1 to SCn connected thereto. The pixel PX supplied with the data signal may control the amount of current flowing from the first power supply ELVDD to the second power supply ELVSS via a light emitting element (not illustrated) in response to the data signal.

At this time, the light emitting device may generate light of a predetermined brightness corresponding to the amount of current. Additionally, the first power supply ELVDD may have a voltage set to be higher than the second power supply ELVSS.

First scan lines SC1 to SCn connected to the pixels PX corresponding to a circuit structure of the pixel PX may be plural.

In some cases, the pixels PX may be connected to light emitting control lines in addition to the first scan lines SC1 to SCn and the data lines D1 to Dm, and in this case, a light emitting driver for outputting light emitting control signals may be further provided.

Figure 2:
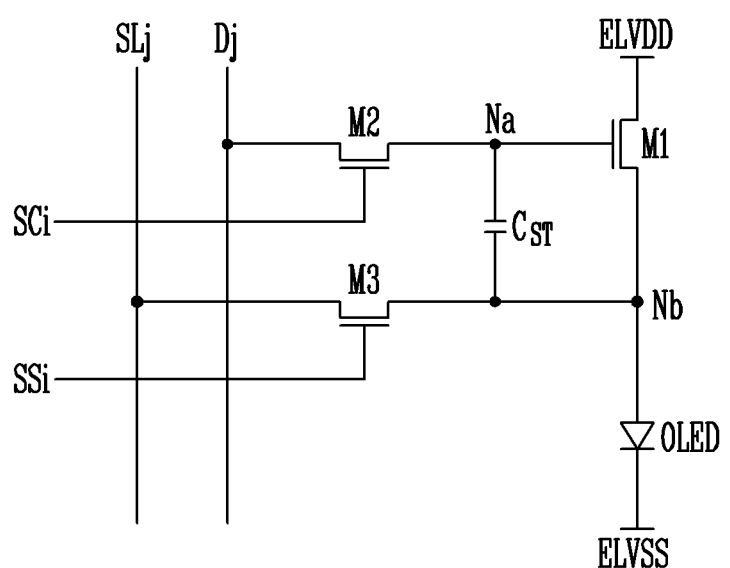
FIG. 2 is a circuit diagram illustrating an example of a pixel included in the display device of FIG. 1.

FIG. 2 is a circuit diagram illustrating an example of the pixel included in the display device of FIG. 1. In FIG. 2, the pixel PX connected to the ith first scan line SCi and the jth data line Dj is illustrated for the sake of convenient description.

The pixel PX may include a drive transistor M1, a switching transistor M2, a sensing transistor M3, a storage capacitor Cst, and a light emitting element OLED.

The switching transistor M2 may include a first electrode connected to the jth data line Dj, a gate electrode connected to the ith first scan line SCi, and a second electrode connected to a first node Na.

The switching transistor M2 may be turned on when a scan signal is supplied from the ith first scan line SCi to supply the data signal received from the jth data line Dj to the storage capacitor Cst. Alternatively, the switching transistor M2 may control a potential of the first node Na.

At this time, the storage capacitor Cst including a first electrode connected to the first node Na and a second electrode connected to a second node Nb can be charged with a voltage corresponding to the data signal.

The drive transistor M1 may include a first electrode connected to the first power supply ELVDD, a second electrode connected to the light emitting device OLED, and a gate electrode connected to the first node Na.

The drive transistor M1 may control the amount of current flowing through the light emitting element OLED in response to a gate-source voltage value.

The sensing transistor M3 may include a first electrode connected to the jth sensing line SLj, a second electrode connected to the second node Nb, and a gate electrode connected to the ith second scan line SSi. The sensing transistor M3 may be turned on when a sensing signal is supplied to the ith second scan line SSi to control a potential of the second node Nb. Alternatively, if the sensing signal is supplied to the ith second scan line SSi, the sensing transistor M3 may be turned on to measure the current flowing through the light emitting device OLED.

The light emitting device OLED may include a first electrode (anode electrode) connected to the second electrode of the drive transistor M1 and a second electrode (cathode electrode) connected to the second power supply ELVSS. The light emitting device OLED may generate light corresponding to the amount of current supplied from the drive transistor M1.

In FIG. 2, the first electrode of each of the transistors M1 to M3 may be set by one of a source electrode and a drain electrode, and the second electrode of each of the transistors M1 to M3 may be set by a different electrode from the first electrode. For example, if the first electrode is set by the source electrode, the second electrode may be set by the drain electrode.

In addition, the transistors M1 to M3 may be NMOS transistors as illustrated in FIG. 2.

While sensing mobility of the drive transistor M1, an activated scan signal is supplied to the first scan line SCi and an activated sensing signal is supplied to the second scan line SSi. However, in order to sense the current flowing through the light emitting device OLED to obtain deterioration information, the drive transistor M1 needs to be turned off and the sensing transistor M3 needs to be turned on. That is, while sensing the current flowing through the light emitting device OLED, an inactive signal has to be applied to the first scan line SCi and an activated signal has to be applied to the second scan line SSi. Therefore, the scan signal supplied to the first scan line SCi and the sensing signal supplied to the second scan line SSi need to be separately supplied.

Figure 3:
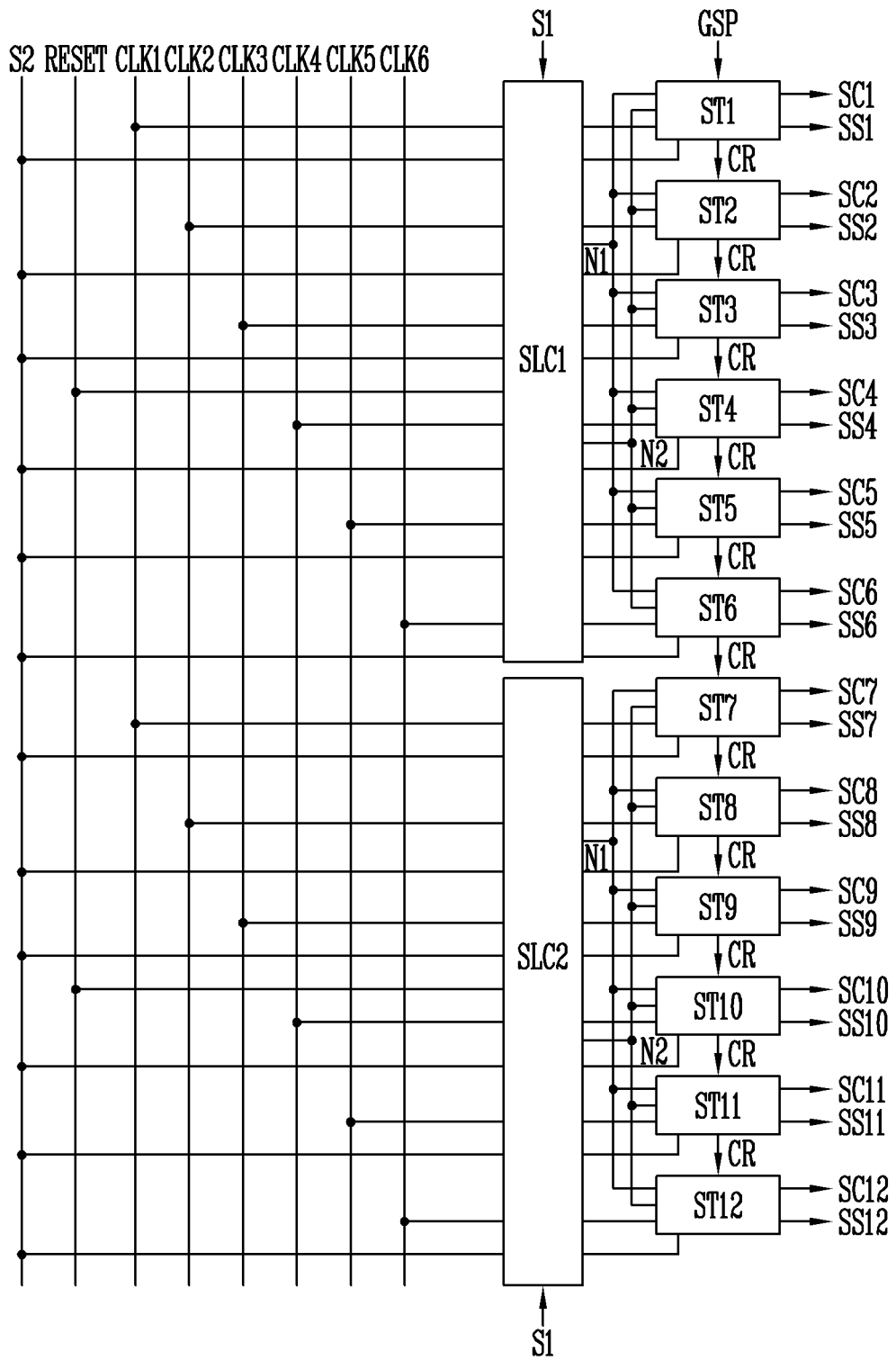
FIG. 3 is a diagram schematically illustrating a scan driver illustrated in FIG. 1.

FIG. 3 is a diagram schematically illustrating the scan driver illustrated in FIG. 1.

Referring to FIG. 3, the scan driver 210 includes a plurality of selective drive circuits SLC1 and SLC2 and a plurality of stages ST1 to ST12 connected to one of the plurality of selective drive circuits SLC1 and SLC2.

In FIG. 3, two selective drive circuits SLC1 and SLC2 are illustrated as an example, but the scan driver 210 may include more or fewer selective drive circuits than two selective drive circuits. In FIG. 3, 12 stages ST1 to ST12 are illustrated as an example, but the scan driver 210 may include more or fewer stages than 12 stages.

FIG. 3 illustrates an example in which six stages ST1 to ST12 are connected to one selective drive circuit SLC1 or SLC2 as the six clock signals CLK1 to CLK6 are supplied to the scan driver 210. However, the inventive concepts are not limited to this, and when a more or less clock signals are supplied to the scan driver 210, the number of stages corresponding to the number of clock signals may be connected to one selective drive circuit.

The stages ST1 to ST6 and ST7 to ST12 sharing the same selective drive circuit SLC1 or SLC2 are connected to the selective drive circuit SLC1 or SLC2 through a first node N1 or a second node N2 which is a common node.

The selective drive circuits SLC1 and SLC2 are supplied with a first control signal S1. The first control signal S1 is synchronized with a carry signal CR (for example, an (i–2)th carry signal CR(i–2)) of a previous stage supplied to the selective drive circuits SLC1 and SLC2 and may be supplied to the selective drive circuits SLC1 and SLC2.

The selective drive circuits SLC1 and SLC2 receive the carry signal CR of the previous stage. The carry signal CR of the previous stage may be a carry signal CR output from any one of the stages ST1 to ST6 or ST7 to ST12 connected to the corresponding selective drive circuits SLC1 or SLC2 or the stages ST1 to STn connected to the other selective drive circuits SLC1 or SLC2 and is not limited to any one in particular.

Each of the stages ST1 to STn is connected to any one of the first scan lines S11 S1n and any one of the second scan lines S21 to S2i, and may supply the first scan signal SC to the first scan lines S11 to S1n and the second scan signal SS to the second scan lines S21 to S2n in response to the scan start signal GSP, the clock signal CLK, the second control signal S2, the first control clock signal SC_CLK, and the second control clock signal SS_CLK.

The first stage ST1 supplies the first scan signal SC to the first scan line S11 connected to the first stage ST1 in response to the scan start signal GSP and supplies the second scan signal SS to the second scan line S21. The remaining stages ST2 to STn supply the first scan signal SC to the first scan lines S12 to S1n connected thereto in response to the carry signal CR supplied from the previous stage and supplies the second scan signal SS to the scan lines S22 to S2n.

The stages ST1 to ST12 are supplied with the first clock signal CLK1 to the sixth clock signal CLK6. The first clock signal CLK1 to the sixth clock signal CLK6 are set to a rectangular wave signal which repeats a high voltage and a low voltage. Here, a high voltage period in one cycle of the first clock signal CLK1 to the sixth clock signal CLK6 may be set to be shorter than a low voltage period. Here, the high voltage period corresponds to a width of the scan signal and may be variously set corresponding to a circuit structure of the pixel PX.

The first clock signal CLK1 to the sixth clock signal CLK6 have the same cycle and are set to a phase-shifted signal. For example, the first clock signal CLK1 to the sixth clock signal CLK6 may be set to be shifted in phase by 1/6 cycle as compared with the clock signal supplied previously.

The second control signal S2 may be selectively supplied to the stage connected to a pixel string to be sensed in the corresponding frame.

The first control clock signal SC_CLK and the second control clock signal SS_CLK are set to a rectangular wave signal which repeats a high voltage and a low voltage. For example, the first control clock signal SC_CLK and the second control clock signal SS_CLK are set to signals having the same cycle and the same phase. Widths of high voltage periods of the first clock signal CLK1 to the sixth clock signal CLK6 may be set such that the first clock signal CLK1 to the sixth clock signal CLK6 overlap the high voltage periods of the first control clock signal SC_CLK and the second control clock signal SS_CLK.

In one exemplary embodiment of the inventive concepts, each of the stages ST1 to STn may be further supplied with a reset signal RESET. The reset signal RESET may be supplied to the stages ST1 to STn during a reset period provided after a sensing period in a vertical blank period and initialize a voltage of the first node N1.

Figure 4:
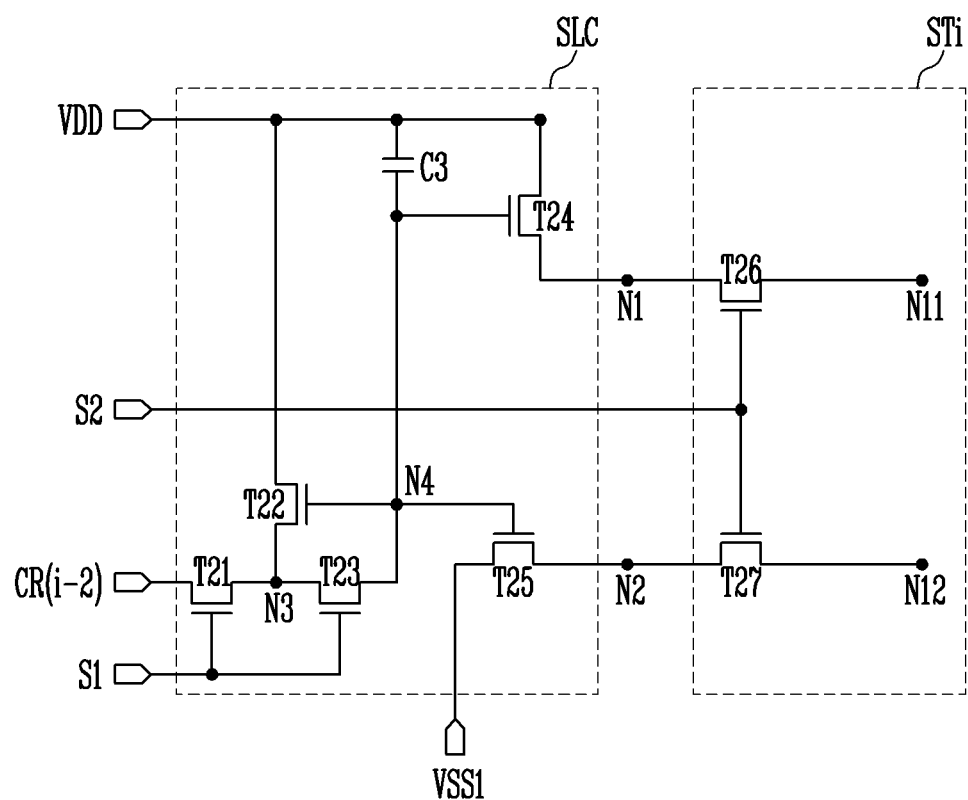
FIG. 4 is a circuit diagram schematically illustrating a part of a selective drive circuit and a stage illustrated in FIG. 3.

FIG. 4 is a circuit diagram schematically illustrating a part of the selective drive circuit and the stage illustrated in FIG. 3. In FIG. 4, only a part of one ith stage STi connected to the selective drive circuit SLC is illustrated for the sake of convenient description. Hereinafter, for the sake of convenient description, it is assumed that providing a certain signal means that a gate-on voltage (for example, a high voltage) is supplied and unproviding a certain signal means that a gate-off voltage (for example, a low voltage) is supplied.

Referring to FIG. 4, the selective drive circuit SLC according to the exemplary embodiment of the inventive concepts is configured to include 21st to 25th transistors T21 to T25 and a third capacitor C3.

A first electrode of the third capacitor C3 is connected to a first power supply VDD and a second electrode is connected to a gate electrode (that is, a fourth node N4) of the 24th transistor T24. The third capacitor C3 stores a voltage corresponding to the gate electrode of the 24th transistor T24. Here, the first power supply VDD may be set to, for example, a gate-on voltage.

The 21st transistor T21 is connected between an input terminal of the (i−2)th carry signal CR(i−2) and a third node N3. A gate electrode of the 21st transistor T21 is connected to an input terminal of the first control signal S. The 21st transistor T21 may be turned on when the first control signal S1 is supplied and supplied to the third node N3 of a voltage corresponding to the (i−2)th carry signal CR(i−2).

The 22nd transistor T22 is connected between the third node N3 and the first power supply VDD. A gate electrode of the 22nd transistor T22 is connected to a fourth node N4. The 22nd transistor T22 is turned on or off in response to a voltage of the fourth node N4.

The 23rd transistor T23 is connected between the third node N3 and the fourth node N4. A gate electrode of the 23rd transistor T23 is connected to an input terminal of the first control signal S1. The 23rd transistor T23 is turned on when the first control signal S1 is supplied to supply a voltage of the third node N3 to the fourth node N4.

The 24th transistor T24 is connected between the first power supply VDD and the first node N1. A gate electrode of the 24th transistor T24 is connected to the fourth node N4. The 24th transistor T24 is turned on or off in response to the voltage of the fourth node N4. If the 24th transistor T24 is turned on, a high voltage of the first power supply VDD is supplied to the first node N1.

The 25th transistor T25 is connected between a second power supply VSS1 and the second node N2. A gate electrode of the 25th transistor T25 is connected to the fourth node N4. The 25th transistor T25 is turned on or off in response to a voltage of the fourth node N4. If the 25th transistor T25 is turned on, a low voltage of the second power supply VSS1 is supplied to the second node N2. Here, the second power supply VSS1 may be set to a voltage lower than the first power supply VDD, for example, a gate-off voltage.

Further referring to FIG. 4, the stage STi according to the exemplary embodiment of the inventive concepts is connected to the selective drive circuit SLC through the first node N1 and the second node N2. The stage STi may be configured to include the 26th transistor T26 and the 27th transistor T27.

The 26th transistor T26 is connected between the first node N1 of the selective drive circuit SLC and an 11th node N11. A gate electrode of the 26th transistor T26 is connected to an input terminal of the second control signal S2. The 26th transistor T26 may be turned on when the second control signal S2 is supplied to electrically connect the first node N1 of the selective drive circuit SLC to an 11th node of the stage STi.

The 27th transistor T27 is connected between the second node N2 of the selective drive circuit SLC and a 12th node N12. A gate electrode of the 27th transistor T27 is connected to an input terminal of the second control signal S2. The 27th transistor T27 may be turned on when the second control signal S2 is supplied to electrically connect the second node N2 of the selective drive circuit SLC to the 12th node of the stage STi.

Figure 5:
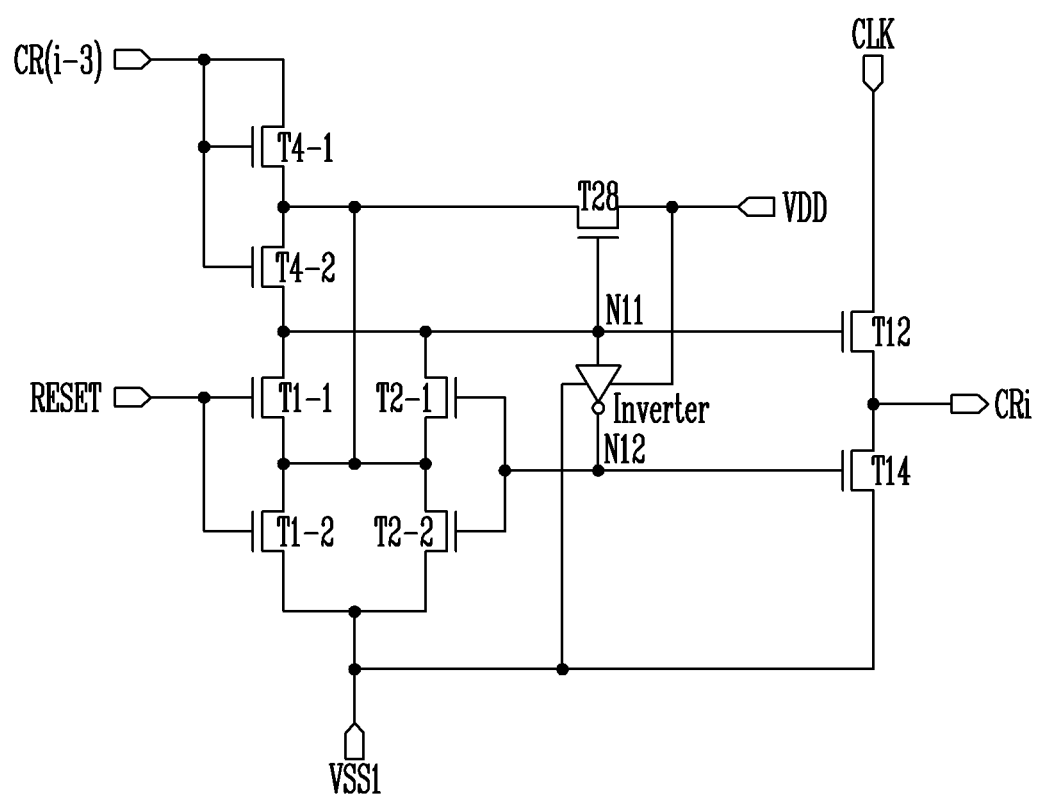
FIG. 5 is a circuit diagram schematically illustrating another part of the stage illustrated in FIG. 3.

FIG. 5 is a circuit diagram schematically illustrating another part of the stage illustrated in FIG. 3. In FIG. 5, only a portion of the ith stage STi is illustrated for the sake of convenient description. Hereinafter, it is assumed that providing a certain signal means that a gate-on voltage (for example, a high voltage) is supplied and unproviding a certain signal means that a gate-off voltage (for example, a low voltage) is supplied for the sake of convenient description.

Referring to FIG. 5, the stage STi according to the exemplary embodiment of the inventive concepts may include first, second, fourth, and 28th transistors T1, T2, T4, and T28, and an inverter. In addition, the stage STi may further include 12th and 14th transistors T12 and T14.

1-1st transistor T1-1 and 1-2nd transistor T1-2 are connected in series between 11th node N11 and the second power supply VSS1. Gate electrodes of the 1-1st transistor T1-1 and the 1-2nd transistor T1-2 are connected to an input terminal of the reset signal RESET. The 1-1st transistor T1-1 and the 1-2nd transistor T2-2 may be turned on when the reset signal RESET is supplied to set a voltage of the 11th node N11 to the second power supply VSS1.

2-1st transistor T2-1 and 2-2nd transistor T2-2 are connected in series between the 11th node N11 and the second power supply VSS1. Gate electrodes of the 2-1st transistor T2-1 and the 2-2nd transistor T2-2 are connected to 12th node N12. The 2-1st transistor T2-1 and the 2-2nd transistor T2-2 may be turned on to set the 11th node N11 to the second power supply VSS1.

4-1st transistor T4-1 and 4-2nd transistor T4-2 are connected in series between the eleventh node N11 and an input terminal of (i−3)th carry signal CR(i−3). Gate electrodes of the 4-1st transistor T4-1 and the 4-2nd transistor T4-2 are connected to the input terminal of the (i−3)th carry signal CR(i−3). The 4-1st transistor T4-1 and the 4-2nd transistor T4-2 may be turned on when the (i−3)th carry signal CR(i−3) is supplied to supply the (i−3)th signal CR(i−3) to the 11th node N11.

The 28th transistor T28 is connected between a common electrode of the 4-1st transistor T4-1 and the 4-2nd transistor T4-2 and the first power supply VDD. A gate electrode of the 28th transistor T28 is connected to the 11th node N11. The 28th transistor T28 is turned on or off in response to a voltage of the 11th node N11.

The inverter is connected between the eleventh node N11 of the 28th transistor T28 and the 12th node N12. The inverter may be driven by power supplied from the first power supply VDD and may supply an inverted voltage of the 11th node N11 to the 12th node N12. The inverter may be configured to include at least one transistor, and detailed structure thereof will be described in detail with reference to FIG. 6.

Referring still to FIG. 5, the 12th transistor T12 is connected between an input terminal of the clock signal CLK and an output terminal of the carry signal CRi. The gate electrode of the 12th transistor T12 is connected to the 11th node N11. The 12th transistor T12 may be turned on when the 11th node N11 is set to a high voltage to output the clock signal CLK as the carry signal CRi.

14th transistor T14 is connected between the output terminal of the carry signal CRi and the second power supply VSS1. A gate electrode of the 14th transistor T14 is connected to a 12th node N12. The 14th transistor T14 may be turned on or off in response to a voltage of the 12th node N12. As the 14th transistor T14 is turned on, a low voltage of the second power supply VSS1 may be output as the carry signal CRi.

In FIG. 5, only the 12th transistor T12 and the 14th transistor T14, which are configured to output the carry signal CRi, are exemplarily illustrated. However, the technical idea of the inventive concepts is not limited thereto. That is, in exemplary embodiments of the inventive concepts, at least one transistor for outputting a sensing signal using the sensing clock signal SS_CLK and at least one transistor for outputting a scan signal using the scan clock signal SC_CLK may be provided.

Figure 6:
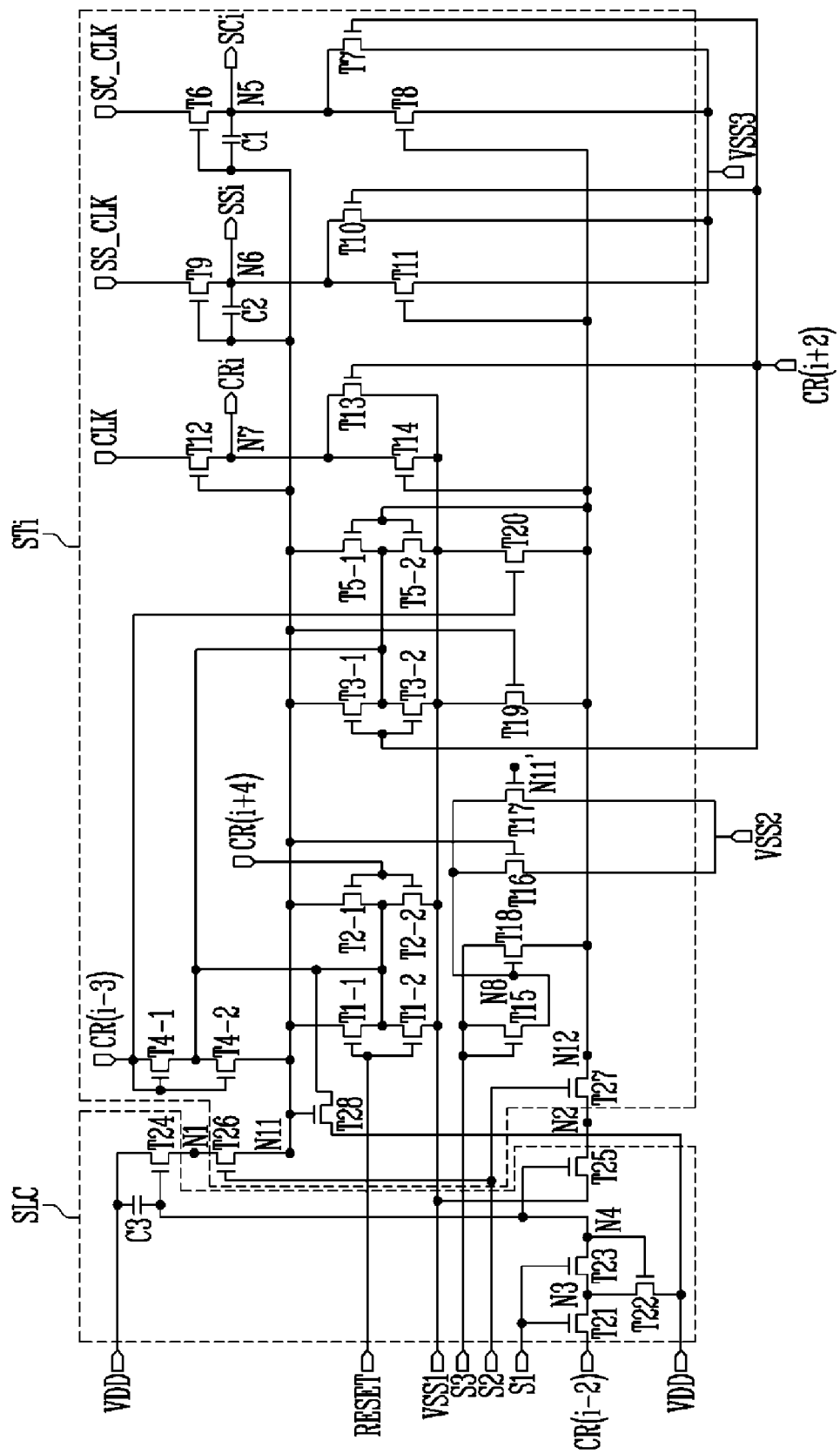
FIG. 6 is a circuit diagram more specifically illustrating the selective drive circuit and the stage illustrated in FIGS. 4 and 5.

FIG. 6 is a circuit diagram more specifically illustrating the selective drive circuit and the stage illustrated in FIGS. 4 and 5. In FIG. 6, only one ith stage STi connected to the selective drive circuit SLC is illustrated for the sake of convenient description. Hereinafter, it is assumed that providing a certain signal means that a gate-on voltage (for example, a high voltage) is supplied and unproviding a certain signal means that a gate-off voltage (for example, a low voltage) is supplied for the sake of convenient description.

Referring to FIG. 6, the selective drive circuit SLC according to the exemplary embodiment of the inventive concepts is configured to include the 21st to 25th transistors T21 to T25 and the third capacitor C3.

A first electrode of the third capacitor C3 is connected to the first power supply VDD and a second electrode thereof is connected to a gate electrode of the 24th transistor T24 (that is, the fourth node N4). The third capacitor C3 stores a voltage corresponding to the gate electrode of the 24th transistor T24. Here, the first power supply VDD may be set to, for example, a gate-on voltage.

The 21st transistor T21 is connected between an input terminal of the i–2nd carry signal CR(i–2) and the third node N3. A gate electrode of the 21st transistor T21 is connected to an input terminal of the first control signal S1. The 21st transistor T21 may be turned on when the first control signal S1 is supplied to supply a voltage corresponding to the i–2nd carry signal CR(i–2) to the third node N3.

The 22nd transistor T22 is connected between the third node N3 and the first power supply VDD. A gate electrode of the 22nd transistor T22 is connected to the fourth node N4. The 22nd transistor T22 is turned on or off in response to a voltage of the fourth node N4.

The 23rd transistor T23 is connected between the third node N3 and the fourth node N4. A gate electrode of the 23rd transistor T23 is connected to an input terminal of the first control signal S1. The 23rd transistor T23 is turned on when the first control signal S1 is supplied to supply a voltage of the third node N3 to the fourth node N4.

The 24th transistor T24 is connected between the first power supply VDD and the first node N1. A gate electrode of the 24th transistor T24 is connected to the fourth node N4. The 24th transistor T24 is turned on or off in response to a voltage of the fourth node N4. If the 24th transistor T24 is turned on, a high voltage of the first power supply VDD is supplied to the first node N1.

The 25th transistor T25 is connected between the fourth node N4, the second power supply VSS1, and the second node N2. A gate electrode of the 25th transistor T25 is connected to the fourth node N4. The 25th transistor T25 is turned on or off in response to a voltage of the fourth node N4. When the 25th transistor T25 is turned on, a low voltage of the second power supply VSS1 is supplied to the second node N2. Here, the second power supply VSS1 may be set to a voltage lower than the first power supply VDD, for example, a gate-off voltage.

Further referring to 6, the stage STi according to the exemplary embodiment of the inventive concepts is connected to the selective drive circuit SLC through the first node N1 and the second node N2. The stage STi is configured to include the first to 20th transistors T1 to T20, the 26th and 27th transistors T26 and T27, the 28th transistor T28, the first capacitor C1, and the second capacitor C2.

The 1-1st transistor T1-1 and the 1-2nd transistor T1-2 are connected in series between the 11th node N11 and the second power supply VSS1. Gate electrodes of the 1-1st transistor T1-1 and the 1-2nd transistor T1-2 are connected to an input terminal of the reset signal RESET. The 1-1st transistor T1-1 and the 1-2nd transistor T1-2 may be turned on when the reset signal RESET is supplied to set a voltage of the 11th node N11 to the second power supply VSS1.

The 2-1st transistor T2-1 and the 2-2nd transistor T2-2 are connected in series between the 11th node N11 and the second power supply VSS1. Gate electrodes of the 2-1st transistor T2-1 and the 2-2nd transistor T2-2 are connected to an input terminal of (i+4)th carry signal CR(i+4). The 2-1st transistor T2-1 and the 2-2nd transistor T2-2 may be turned on when the (i+4)th carry signal CR(i+4) is supplied to set a voltage of the 11th node N11 to the second power supply VSS1.

3-1st transistor T3-1 and 3-2nd transistor T3-2 are connected in series between the 11th node N11 and the second power supply VSS1. Gate electrodes of the 3-1st transistor T3-1 and the 3-2nd transistor T3-2 are connected to an input terminal of the (n−1)th carry signal CR(n−1). The 3-1st transistor T3-1 and the 3-2nd transistor T3-2 may be turned on when an (n−1)th carry signal CR(n−1) is supplied to supply the second power supply VSS1 to the 11th node N11.

4-1st transistor T4-1 and 4-2nd transistor T4-2 are connected in series between the 11th node N11 and an input terminal of the (i−3)th carry signal CR(i−3). Gate electrodes of the 4-1st transistor T4-1 and the 4-2nd transistor T4-2 are connected to the input terminal of the (i−3)th carry signal CR(i−3). The 4-1st transistor T4-1 and the 4-2nd transistor T4-2 may be turned on when the (i−3)th carry signal CR(i−3) is supplied to supply the i–3th carry signal CR(i−3) to the 11th node N11.

5-1st transistor T5-1 and 5-2nd transistor T5-2 are connected in series between the 11th node N11 and the second power supply VSS2. Gate electrodes of the 5-1st transistor T5-1 and the 5-2nd transistor T5-2 are connected to the 12th node N12. The 5-1st transistor T5-1 and the 5-2nd transistor T5-2 are turned on or off in response to power of the 12th node N12. When the 5-1st transistor T5-1 and the 5-2nd transistor T5-2 are turned on, a voltage of the second power supply VSS2 may be supplied to the 11th node N11.

A sixth transistor T6 is connected between an input terminal of the first control clock signal SC_CLK and an output terminal of the first scan signal SC (that is, a fifth node N5). A gate electrode of the sixth transistor T6 is connected to the 11th node N11. The sixth transistor T6 may be turned on when the 11th node N11 is set to a high voltage to output the first control clock signal SC_CLK as the first scan signal SCi.

A seventh transistor T7 is connected between a fifth node N5 and a fourth power supply VSS3. A gate electrode of the seventh transistor T7 is connected to an input terminal of (i+2)th carry signal CR(i+2). The seventh transistor T7 may be turned on when the (i+2)th carry signal CR(i+2) is input to set a voltage of the fifth node N5 to a voltage of the fourth power supply VSS3. Here, the fourth power supply VSS3 may be set to a voltage lower than the second power supply VSS1.

An eighth transistor T8 is connected between the fifth node N5 and the fourth power supply VSS3. A gate electrode of the eighth transistor T8 is connected to the 12th node N12. The eighth transistor T8 may be turned on or off in response to a voltage of the 12th node N12. As the eighth transistor T8 is turned on, a low voltage of the fourth power supply VSS3 may be output as the first scan signal SCi.

A ninth transistor T9 is connected between an input terminal of the second control clock signal SS_CLK and an output terminal (that is, a sixth node N6) of the second scan signal SS. A gate electrode of the ninth transistor T9 is connected to the 11th node N11. The ninth transistor T9 may be turned on when the 11th node N11 is set to a high voltage to output the second control clock signal SS_CLK as the second scan signal SSi.

A tenth transistor T10 is connected between the sixth node N6 and the fourth power supply VSS3. A gate electrode of the tenth transistor T10 is connected to an input terminal of the (i+2)th carry signal CR(i+2). The tenth transistor T10 i may be turned on when the (i+2)th carry signal CR(i+2) is input to set a voltage of the sixth node N6 to a voltage of the fourth power supply VSS3.

An 11th transistor T11 is connected between the sixth node N6 and the fourth power supply VSS3. A gate electrode of the eleventh transistor T11 is connected to the 12th node N12. The 11th transistor T11 may be turned on or off in response to a voltage of the 12th node N12. As the 11th transistor T11 is turned on, a low voltage of the fourth power supply VSS3 may be output as the second scan signal SSi.

A 12th transistor T12 is connected between an input terminal of the clock signal CLK and an output terminal of the carry signal CRi (that is, is, a seventh node N7). A gate electrode of the 12th transistor T12 is connected to the 11th node N11. The 12th transistor T12 may is turned on when the 11th node N11 is set to a high voltage to output the clock signal CLK as the carry signal CRi.

A 13th transistor T13 is connected between a seventh node N7 and the second power supply VSS1. A gate electrode of the 13th transistor T13 may be connected to the (i+2)th carry signal CR(i+2). The 13th transistor T13 may be turned on when the (i+2)th carry signal CR(i+2) is supplied to set a voltage of the seventh node N7 to a voltage of the second power supply VSS1.

The 14th transistor T14 is connected between the seventh node N7 and the second power supply VSS1. A gate electrode of the 14th transistor T14 is connected to the 12th node N12. The 14th transistor T14 may be turned on or off in response to a voltage of the 12th node N12. As the 14th transistor T14 is turned on, a low voltage of the second power supply VSS1 may be output as the carry signal CRi.

The 15th transistor T15 is connected between an input terminal of the third control signal S3 and a gate electrode of the 18th transistor T18 (that is, an eighth node N8). A gate electrode of the 15th transistor T15 is connected to an input terminal of the third control signal S3. The 15th transistor T15 may be connected in a diode form when the third control signal S3 is supplied to supply the third control signal S3 to the eighth node N8.

The 16th transistor T16 is connected between the eighth node N8 and the third power supply VSS2 of a next stage. A gate electrode of the 16th transistor T16 is connected to the 11th node N11. The sixteenth transistor T16 may be turned on when the eleventh node N11 is set to a high voltage to supply a voltage of the third power supply VSS2 to the eighth node N8. Here, the third power supply VSS2 may be set to be lower than the second power supply VSS1 and to be higher than the fourth power supply VSS3.

A 17th transistor T17 is connected between the eighth node N8 and the third power supply VSS2. A gate electrode of the 17th transistor T17 is connected to the 11th node N11' of a next stage. The 17th transistor T17 is turned on or off in response to the 11th node N11' of the next stage.

An 18th transistor T18 is connected between the third control signal S3 and the 12th node N12. A gate electrode of the 18th transistor T18 is connected to the eighth node N8. The 18th transistor T18 is turned on or off in response to a voltage of the eighth node N8. As the 18th transistor T18 is turned on, a voltage of the third control signal S3 may be supplied to the 12th node N12.

A 19th transistor T19 is connected between the 12th node N12 and the second power supply VSS1. A gate electrode of the 19th transistor T19 is connected to the 11th node N11. The 19th transistor T19 may be turned on when a high voltage is supplied to the 11th node N11 to set a voltage of the 12th node N12 as a low voltage of the second power supply VSS1.

A 20th transistor T20 is connected between the 12th node N12 and the second power supply VSS1. A gate electrode of the 20th transistor T20 is connected to an input terminal of the (i−3)th carry signal CR(i−3). The 20th transistor T20 may be turned on when the (i−3)th carry signal CR(i−3) is supplied to set a voltage of the 12th node N12 as a low voltage of the second power supply VSS1.

The 26th transistor T26 is connected between the first node N1 and the eleventh node N11. The gate electrode of the 26th transistor T26 is connected to the input terminal of the second control signal S2. The 26th transistor T26 may be turned on when the second control signal S2 is supplied to supply the voltage of the first node N1 to the eleventh node N11.

A 27th transistor T27 is connected between the second node N2 and the 12th node N12. A gate electrode of the 27th transistor T27 is connected to an input terminal of the second control signal S2. The 27th transistor T27 may be turned on when the second control signal S2 is supplied to supply a voltage of the second node N2 to the 12th node N12.

A 28th transistor T28 is connected between a common electrode of the 4-1st transistor T4-1 and the 4-2nd transistor T4-2 and the first power supply VDD. A gate electrode of the 28th transistor T28 is connected to the 11th node N11. The 28th transistor T28 is turned on or off in response to a voltage of the 11th node N11.

The first capacitor C1 is connected between the fifth node N5 and the first node N1. The second capacitor C2 is connected between the sixth node N6 and the first node N1. The first capacitor C1 and the second capacitor C2 store voltages corresponding to the first node N1.

Figure 7:
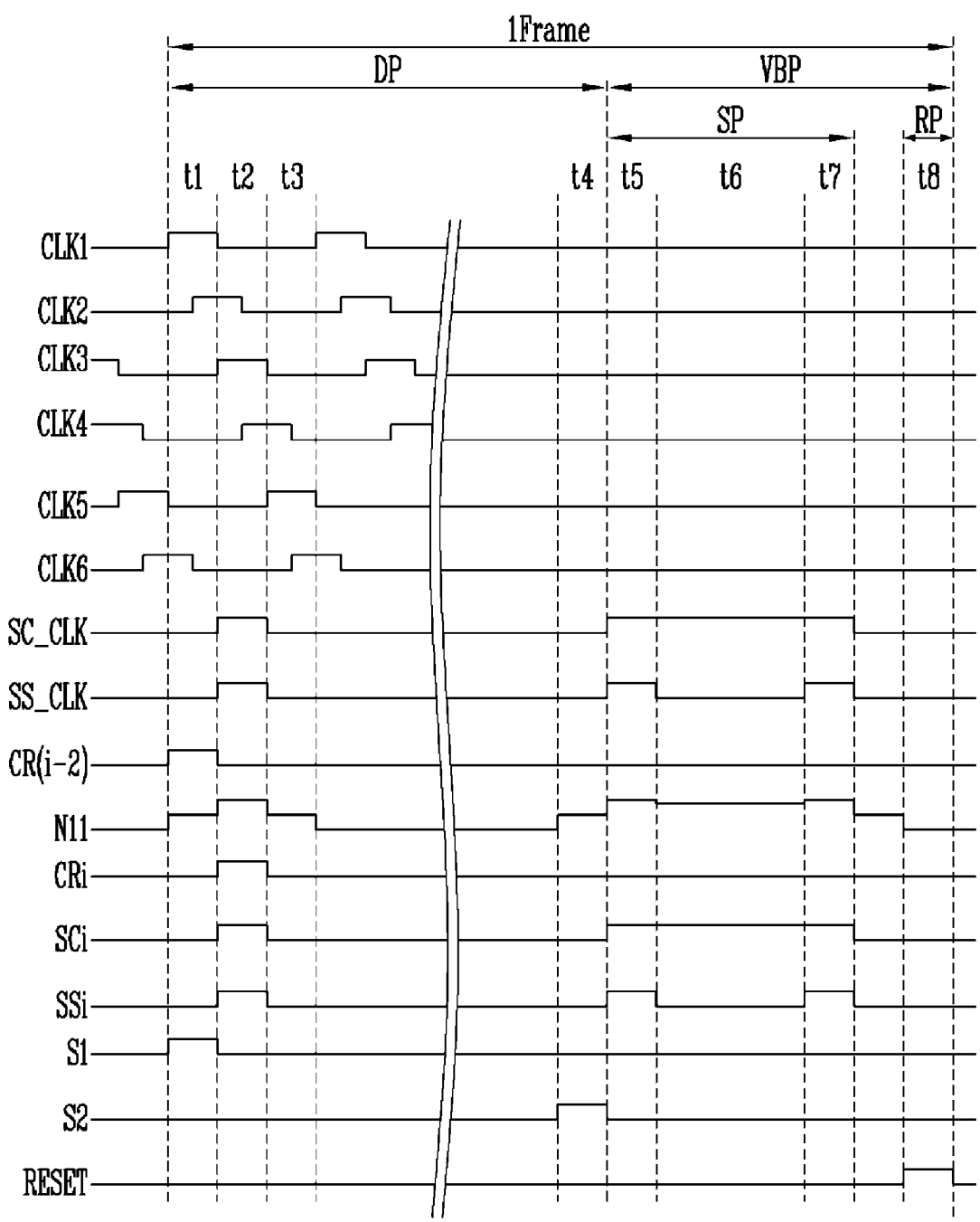
FIG. 7 is a waveform diagram illustrating an exemplary embodiment of a drive method of the stage illustrated in FIG. 6.

FIG. 7 is a waveform diagram illustrating an exemplary embodiment of the drive method of the stage illustrated in FIG. 6. FIG. 7 illustrates an example in which the ith pixel string is sensed during a sensing period. Here, the ith pixel string is connected to the ith stage STi which receives the third clock signal CLK3, and the ith stage STi shares the selective drive circuit SLC with at least one different stage.

In addition, referring to FIG. 7, one frame period includes a display period DP and a vertical blank period VBP, and the vertical blank period VBP may include a sensing period SP and a reset period RP.

Referring to FIGS. 6 and 7, the (i−2)th carry signal CR(i−2) and the (i−1)th first control signal S1 are supplied to the selective drive circuit SLC in synchronization with the first clock signal CLK1 during a first period t1. As the first control signal S1 is supplied, the 21st transistor T21 and the 23rd transistor T23 of the ith stage STi are turned on. If the 21st transistor T21 and the 23rd transistor T23 are turned on, a high voltage of the (i−2)th carry signal CR(i−2) is supplied to the fourth node N4. If a high voltage is supplied to the fourth node N4, the 22nd transistor T22, the 24th transistor T24, and the 25th transistor T25 are turned on.

If the 22nd transistor T22 is turned on, a high voltage of the first power supply VDD is supplied to the third node N3, and thereby, the high voltage of the third node N3 may be stably maintained.

If the 24th transistor T24 is turned on, the high voltage of the first power supply VDD is supplied to the first node N1. At this time, the third capacitor C3 stores a high voltage of the fourth node N4.

If the 25th transistor T25 is turned on, a low voltage of the second power supply VSS1 is supplied to the second node N2.

Meanwhile, since the (i−3)th carry signal CR(i−3) is supplied and the 4-1st and 4-2nd transistors T4-1 and T4-2 are turned on during the first period t1, a high voltage is supplied s1 to the first node N11.

The third clock signal CLK3, the first control clock signal SC_CLK, and the second control clock signal SS_CLK are supplied to the stage STi during a second period t2. While the 11th node N11 is set to a high voltage, the sixth transistor T6, the ninth transistor T9, and the 12th transistor T12 are turned on, and thereby, the carry signal CRi, the first scan signal SCi, and the second scan signal SSi are output.

At this time, a voltage of the 11th node N11 may be set to a higher voltage than the voltage in the first period t1 by coupling of the first capacitor C1 and the second capacitor C2.

If the fifth carry signal CR5 is supplied to the stage STi during a third period t3, the 13th transistor T13 is turned on and the voltage of the 11th node N11 is set to the low voltage of the second power supply VSS1 again.

The second control signal S2 is supplied to the stage STi during a fourth period t4. As the second control signal S2 is supplied, the 26th transistor T26 and the 27th transistor T27 are turned on. If the 26th transistor T26 is turned on, the high voltage of the first node N1 is to supplied to the 11th node N11. In addition, if the twenty-seventh transistor T27 is turned on, the low voltage of the second node N2 is supplied to the 12th node N12.

The first control clock signal SC_CLK and the second control clock signal SS_CLK are supplied to the stage STi during a fifth period t5. At this time, since the eleventh node N11 is set to a higher voltage, the sixth transistor T6 and the ninth transistor T9 are turned on, and the first scan signal SCi and the second scan signal SSi are output. The voltage of the $11^{th}$ node N11 may be set to a higher voltage than the voltage in the fourth period t4 by coupling of the first capacitor C1 and the second capacitor C2.

During the fifth period t5, characteristics (for example, a threshold voltage, mobility, and the like) of the drive transistor provided in the pixel PX may be measured.

During the sixth period t6, supplying the second control clock signal SS_CLK to the stage STi is stopped. Then, an output of the second scan signal SSi is stopped, and the coupling of the first capacitor C1 is released, and thereby, the voltage of the 11th node N11 may be set to a voltage lower than the voltage in the fifth period t5.

During the sixth period t6, characteristics of the organic light emitting diode provided in the pixel PX may be measured.

During the seventh period t7, the first control clock signal SC_CLK and the second control clock signal SS_CLK are supplied to the stage STi. At this time, since the 11th node is set to a high voltage, the sixth transistor T6 and the ninth transistor T9 are turned on and the first scan signal SCi and the second scan signal SSi are output. The voltage of the 11th node N11 may be set to a higher voltage than the voltage in the fourth period t4 by the coupling of the first capacitor C1 and the second capacitor C2.

During the seventh period t7, the data signal in the corresponding frame is supplied to the pixel PX, and thereby, the drive transistor may be initialized.

During the eighth period t8, the reset signal RESET is supplied to the stage STi. As the reset signal RESET is supplied, the 1-1st and 1-2nd transistors T1-1 and T1-2 are turned on, and the voltage of the 11th node N11 is initialized to a low voltage of the second power supply VSS1.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A scan driver comprising:
   stages connected to respective scan lines, the stages configured to supply scan signals to the scan lines in response to voltages of 11th and 12th nodes; and
   a selective drive circuit connected to i stages, where i is a natural number equal to or greater than 2, the selective drive circuit comprising a first node and a second node,
   wherein each of the stages comprises a first connection transistor connected between the first node and the 11th node and a second connection transistor connected between the second node and the 12th node,
   wherein the first connection transistor and the second connection transistor are configured to be turned on by a second control signal to electrically connect the first node to the 11th node and the second node to the 12th node, respectively, and
   wherein the selective drive circuit comprises:
   a first transistor connected between an input terminal of a first carry signal and a third node, the first transistor comprising a gate electrode connected to an input terminal of a first control signal;
   a second transistor connected between the third node and a first power supply, the second transistor comprising a gate electrode which is connected to a fourth node;

a third transistor connected between the third node and the fourth node, the third transistor comprising a gate electrode connected to an input terminal of the first control signal;

a fourth transistor connected between the first power supply and the first node, the fourth transistor comprising a gate electrode connected to the fourth node;

a fifth transistor connected between the fourth node and a second power supply, the fifth transistor comprising a gate electrode connected to the fourth node; and a capacitor connected between the first power supply and the fourth node.

2. The scan driver according to claim 1, wherein the first carry signal and the first control signal are configured to overlap each other at least once during a display period in a frame.

3. The scan driver according to claim 1, wherein the first transistor, the second transistor, and the third transistor are configured to control a voltage of the fourth node in response to the first carry signal and the first control signal.

4. The scan driver according to claim 1, wherein the fourth transistor is configured to be turned on in response to a voltage of the fourth node to supply the first node with a voltage of the first power supply.

5. The scan driver according to claim 1, wherein the fifth transistor is configured to be turned on in response to a voltage of the fourth node to supply the second node with a voltage of the second power supply.

6. The scan driver according to claim 1, wherein the second control signal is configured to be supplied to at least one selected stage during a display period in one frame.

7. The scan driver according to claim 6, wherein the selected stage is configured to supply a first scan signal to a first scan line in response to a voltage of the 11th node and supply a second scan signal to a second scan line in response to a voltage of the 12th node during a sensing period between the display periods.

8. The scan driver according to claim 1, wherein each of the stages further comprises an initialization transistor configured to initialize a voltage at the 11th node to a voltage of the second power supply in response to a reset signal.

9. The scan driver according to claim 1, wherein the i stages that are connected to the same selective drive circuit are configured to be supplied with first to ith clock signals, respectively.

10. The scan driver according to claim 9, wherein the first to ith clock signals are configured to have the same period, and the nth clock signal is shifted in phase by 1/i cycle as compared with the (n−1)th clock signal, where n is a natural number from 2 to i.

11. The scan driver according to claim 9, wherein the i stages are configured to each output a carry signal to a next stage in response to the first through ith clock signals.

* * * * *